United States Patent [19]

Sullivan

[11] Patent Number: 4,756,929
[45] Date of Patent: Jul. 12, 1988

[54] HIGH DENSITY PRINTING WIRING

[76] Inventor: Donald F. Sullivan, 115 Cambridge Rd., King of Prussia, Pa. 19406

[21] Appl. No.: 681,686

[22] Filed: Dec. 14, 1984

Related U.S. Application Data

[63] Continuation-in-part of Ser. No. 550,379, Nov. 10, 1983, Pat. No. 4,528,259.

[51] Int. Cl.$^4$ .................. B05D 5/12; G03C 5/00; H05K 1/00; H05K 3/02
[52] U.S. Cl. ......................... 427/96; 29/846; 174/68.5; 427/98; 430/312; 430/313; 430/315
[58] Field of Search .............. 427/96, 98; 430/315, 430/312, 313; 29/527.2, 846, 848; 174/68.5

[56] References Cited

U.S. PATENT DOCUMENTS

| | | | |
|---|---|---|---|
| 4,374,457 | 2/1983 | Wiech | 29/848 |
| 4,508,753 | 4/1985 | Stepan | 427/53.1 |
| 4,521,449 | 6/1985 | Arnold | 427/96 |
| 4,526,810 | 7/1985 | Nesbitt | 430/315 |
| 4,528,259 | 7/1985 | Sullivan | 430/312 |
| 4,532,152 | 7/1985 | Elarde | 427/96 |

FOREIGN PATENT DOCUMENTS 2126428  3/1984  United Kingdom .

Primary Examiner—Michael R. Lusignan
Attorney, Agent, or Firm—Laurence R. Brown

[57] ABSTRACT

Densely packed high resolution printed wiring boards may be achieved by providing channels below grade in a substrate planar surface, thereby providing greater conductor width for closely spaced conductors. By mechanically removing the substrate surface between the channels, high virtual resolution is obtained with high quality conductors and insulation spacings of the order of about 0.003 inch, and with actual conductor widths of greater than 0.012 inch. Thus the packing density of printed wiring patterns may be increased significantly. Also the quality of conductor adherence and conductivity is improved. Thus a non-critical and inexpensive process unexpectedly provides an improved quality, more precise printed wiring pattern.

5 Claims, 1 Drawing Sheet

HIGH DENSITY PRINTING WIRING

BACKGROUND ART

This is a continuation-in-part of my copending application Ser. No. 550,379, filed Nov. 10, 1983 now U.S. Pat. No. 4,528,259, patented July 9, 1985, for Printed Wiring Boards With Solder Mask Over Bare Copper Wires Having Large Area Thickened Circuit Pad Connections.

TECHNICAL FIELD

This invention relates to manufacture of printed wiring boards, and more specifically it relates to improvements in the use of the surface area of a printed wiring board substrate for better conductor adherence, conductivity and packing density.

Conventionally in the printed circuit arts, a printed wiring pattern is formed on a thin metallic deposit or laminate on a flat insulating substrate body. Thus the conductor lines are thin, generally copper, ribbons of a standardized thickness of about 0.0014 in. Several problems exist in making quality trouble free boards, including (1) adhesion problems between the insulating substrate and the copper ribbon conductor, (2) the conductivity of the conductor lines as the lines become small and the packing density great, and (3) the resolution of the patterning procedure for forming the lines, particularly where packing densities become high, which may cause short circuiting between two adjacent closely positioned lines. Thus, in high density wiring patterns, parallel conductors of about 0.005 in. width separated by insulation spaces on the substrate surface of about 0.005 in. are not easily manufactured. Thus, consider that etching processes in formulating the pattern are likely to undercut the copper ribbon and reduce adhesion area. Furthermore, it is difficult to assure adherance between the copper and the insulating substrate surface to the extent that there are no defect areas that could cause malfunctions with conductor line widths of 0.005 in. or less. Similarly, slight impurity centers in the deposit or layer of conductor may give conductivity problems with these narrow line widths.

Furthermore whenever copper etching solutions have a tendency to pollute the environment, a process which avoids the etching of a flat copper sheet to produce a wiring pattern would be advantageous. Other problems exist, such as keeping the copper surface free of minute scratches which cause the photoresist placed on the copper sheet to define the conductor patterns for etching to be undercut by the etching solution. This may cause conductor discontinuities, etc. Similarly specks of dust can cause similar imperfections.

With physical limitations of materials, thicknesses, photoresponses, coefficients of thermal expansion, photo resolutions, fragility and damage proness in handling, and manufacturing tolerances, it is clearly difficult to improve line resolutions and spacings to increase packing densities significantly beyond the 0.005 in. barrier.

It is therefore an object of this invention to provide improved printed circuit boards and methods of manufacture, wherein these prior art problems are resolved.

DISCLOSURE OF THE INVENTION

There are requirements for more densely packed printed wiring patterns with better quality and fewer defects. Because of the aforementioned problems, it appears mutually inconsistent to have better conductor adherence, better conductivity quality, no undercutting, and better resolution, particularly if the frontiers of density are pushed back to provide for less than 0.005 in. spacing between conductors. However this invention does just that.

It is an unexpected advance in the art, that wiring pattern densities on a printed wiring board substrate can be increased while the width of the conductor ribbons is increased, which is afforded by this invention. This is very simply achieved by producing channels in the substrate surface into which the thin conductor ribbons are placed on both the bottom and sidewalls of typically U shape thereby to have a greater conductor width, adherence and conductivity than would have been possible on the surface. Furthermore, the conductors are not subject to scratching or damage in handling as are surface mounted conductors. With this technique at the present state of the art, it for the first time becomes feasible to provide reliable printed wiring boards with conductor lines separated by spacings of about 0.003 in. or less. Furthermore with 0.003 in. wide channels of a depth of about 0.006 in., the conductor lines are about five times as wide as the 0.003 in. surface space they occupy.

The channels are readily made by photoexposure of a layer of photopolymer disposed on a flat substrate insulation surface. Preferably the photopolymer layer is thicker than 0.002 in. and preferably about 0.006 in. With techniques now available in the art, this layer can be photo processed to obtain high resolution channels of about 0.003 in. width for defining the conductor trace positions between flat top ridges of 0.003 in. that define the level surface of the substrate into which the channels are indented.

Further the substrate surface is then processed by electroless plating over the entire surface in a conventional step. In one embodiment, the flat surface layer is mechanically removed such as by wet sanding, and the electroless plating in the channels reinforced to appropriate thickness by conventional methods.

In another embodiment, a plating resist is roller plated over the flat ridge tops and the initial electroless coating is used as the plating-electrode for electroplating the resulting channel surfaces to the desired thickness. Then the flat tops are mechanically removed down to the insulating substrate. No chemical etching of the copper conductor is thus required, thereby eliminating a pollution source.

THE PREFERRED EMBODIMENTS

Figure 1:
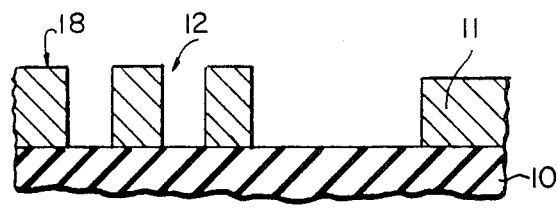
FIGS. 1 to 6 are diagrammatic sketches in section view showing a printed circuit board afforded by the invention and the various steps of the manufacturing process.

As shown in FIGS. 1 to 6 the flat substrate surface 18 of a printed wiring board 10 has channels 12 indented therein for receiving thin wiring ribbon conductors 17 therein on the surface of the bottom and sidewalls. Thus the flat top portions 18 of the resulting substrate surface form insulation spacings between adjacent conductors. In this manner, adjacent closely spaced conductors are supplied with a known precise distance of insulation surface therebetween to prevent that possibility of short circuiting due to poor resolution, improper etching, etc.

of conventionally prepared flat surface mounted circuits. Furthermore with the indented circuit configuration, scratching and damage from handling is much less likely.

While the indented surfaces may be made in various ways, specific preferred processes are herein disclosed, which advantageously use the present state of the art to provide inexpensive, uncritical process steps and very dense circuit potential, realistically permitting adjacent spacing at 0.003 in. centers along the flat outer surface plane of the substrate of conductors and insulation spaces. Also the rectangular cornered U shaped channels are not required, but are preferred to provide a maximum surface contact width of the conductor ribbons, which surprizingly enough are much wider with better adhesion and conductivity, even when placed more densely on the printed wiring boards, and take up only a very narrow conductor space on the board outer flat planar surface.

As may be seen from FIG. 1, an insulating support body 10, such as those conventionally clad on a flat insulation surface with a copper coating from which the wiring pattern is formed, has printed on its surface a patterned photopolymer layer 11 which forms the indented channels 12 into which the conductors will be formed as a thin surface coating, typically 0.0014 in. thick copper. The photopolymer layer is preferably about 0.006 in. thick and is patterned with high resolution phototechnology to provide the separate squared off channels and ridges, with wiring center separations defined by the channels and ridges, each of 0.003 in. width, for example. The photopolymer layer 11 may be provided as taught in my invention for Printed Wiring Board, Ser. No. 364,309, filed Apr. 1, 1982, now U.S. Pat. No. 4,506,004, issued Mar. 19, 1985, for example.

A significant advantage of contouring the surface of the printed circuit substrate is the increase of surface area upon which the conductors may be disposed. Another is the below grade position of the conductor layer, thereby to avoid surface scratches, etc. during handling. An improvement of surface area for the conductor will come with any shape of surface in the channel. However for maximizing surface area with conductor pattern density, deep U shaped channels are preferred. Thus, assuming 0.003 in. channel width and 0.006 in. depth the vertical conductor width for purpose of density is only 0.003 in., but the actual conductor width as placed on the bottom and side walls of the channels is close to five times that, being 0.006 in.+0.003 in+0.006 in=0.015 in. Even allowing for conductor thicknesses to decrease the effective width somewhat, nevertheless this invention improves the quality of the conductors as well as the circuit density.

Figure 2:
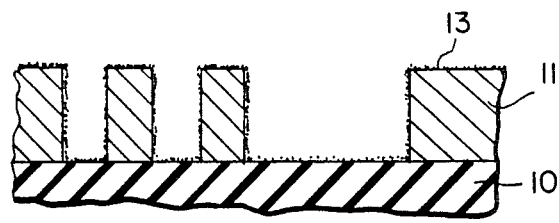

As seen in FIG. 2, a layer 13 is deposited on the contoured outer board surface, which is distinguished from the flat outer planar surface defined by the flat topped ridges 18. This is typically a catalyzing coating which permits electroless deposition of a metallic conductor layer of copper or the like, thereover as indicated at 15 in FIG. 3. In a first embodiment of this invention, the catalytic coating 13 is removed from the flat outer planar surface mechanically such as by wet sanding and then a thick electroless coating 17 is applied to provide the final circuit configuration of FIG. 6.

Figure 3:
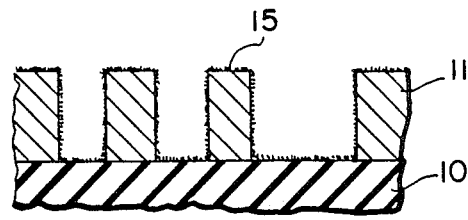
Figure 4:
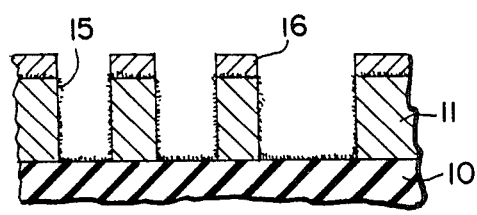
Figure 5:
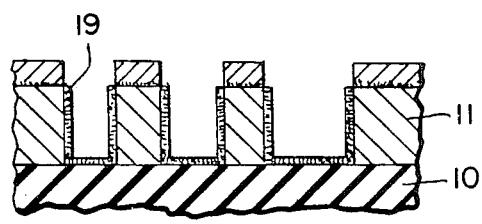
Figure 6:
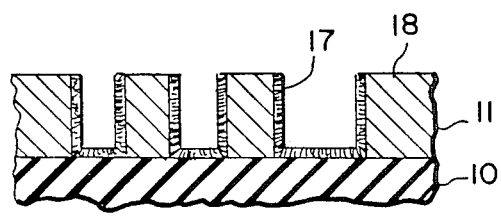

In a second embodiment, the thin electroless coating of FIG. 3 is roller coated over the top surface with a plating resist coating 16 as shown in FIG. 4. The electroless coating then serves as an electrode for electroplating a thicker layer 19 thereover, where exposed in the channels 12, thereby to produce the configuration of FIG. 5. The top flat substrate surface is then mechanically treated as by wet sanding to remove the plating resist and the electroless layer to provide the circuit pattern of FIG. 6 with the conductors disposed in the chanels 12. Other metallization processes may be used, but it is particularly advantageous to avoid the chemical etching steps conventional in the manufacture of printed wiring boards. Thus, the mechanical removal of the layer(s) from the flat tops 18 of the ridges provides improved and inexpensive treatment that assures a high quality precisely spaced insulation barrier between adjacent conductors thereby virtually improving the resolution to a degree unobtainable with any photo or etching process. Realistically at this stage of the art therefore side by side parallel conductors and insulators may be provided with surface widths of 0.003 in. or less.

Having therefore improved the state of the art, those novel features of the invention believed descriptive of the spirit and nature of the invention are defined with particularity in the following claims.

1. The method of increasing the number of thin conductive layer printed wiring conductor lines that may be disposed on the surface of a printed wiring board insulating support body, comprising the steps of, disposing on said surface a layer of photopolymer, photo processing the photopolymer layer to produce a flat polymer outer surface with indented channels reaching to the surface of said insulating substrate thereby defining conductor paths by both two side wall surfaces on the polymer layer spanned by the substrate surface thereby to present significantly more surface area in the indented channels than afforded by the alternating flat ridge tops spaced between the conductor paths to define insulation spacings of precise dimensions between the conductor channels, and disposing on the indented channels the conductive lines comprising a surface coating of metallic electrical conductive material of predetermined thickness to produce thereby wider conductor lines more closely spaced together than possible on a flat surface with insulation spaces between the conductors and providing adjacent conductor lines that are less likely to short circuit by mechanically processing the flat ridge tops to assure that all conductive materials are removed therefrom in a manner without damage to the conductor lines on said side walls because of the flatness of the polymer outer surface.

2. The method of claim 1 including the step of making the intended channels U-shaped of rectangular configuration by high resolution photo processing of a liquid photopolymer layer, thereby to maximize the width of the conductors disposed therein.

3. The method of claim 2 including the steps of making the depth of the indented channels greater than about 0.004 inch and the spacing between the channels closer than about 0.005 inch thereby to produce high packing density wiring configurations of a width of about 0.013 inch.

4. The method of claim 1 including the step of metallizing the surface in said indented channels to a thickness of about 0.0014 inch to form the conductor lines.

5. The method of producing high density printed wiring boards having a plurality of closely spaced parallel conductors in a wiring pattern with conductor widths greater than the insulation spacing between adjacent conductors, comprising the steps of, providing on the surface of a substantially flat planar insulating printed wiring board surface a photopolymer layer, photoprinting in the photopolymer layer a plurality of channels extending below the photopolymer surface having a channel width substantially equal to the spacing on the photopolymer surface between the channels, and selectively covering the surface of said channels with a metallic conductor without disposing the conductor on the spacing of the photopolymer surface between the channels thereby to provide conductor lines wider than the spacing between the channels.

* * * * *